United States Patent [19]
Olsen

[11] Patent Number: 5,502,390
[45] Date of Patent: Mar. 26, 1996

[54] ADIABATIC CONDUCTOR ANALYZER METHOD AND SYSTEM

[75] Inventor: Floyd W. Olsen, Athens, Pa.

[73] Assignee: International Business Machines Corporation, Armonk, N.Y.

[21] Appl. No.: 213,352

[22] Filed: Mar. 15, 1994

[51] Int. Cl.⁶ .................................................. G01R 31/12
[52] U.S. Cl. ......................... 324/537; 324/719; 324/73.1
[58] Field of Search .................................... 324/537, 522, 324/523, 705, 719, 724, 763, 765, 754

[56] References Cited

U.S. PATENT DOCUMENTS

| | | | |
|---|---|---|---|
| 3,396,335 | 8/1968 | Burr et al. | 324/51 |
| 4,213,087 | 7/1980 | English et al. | 324/62 |
| 4,281,449 | 8/1981 | Ports et al. | 324/537 |
| 4,588,945 | 5/1986 | Groves et al. | 324/73.1 |
| 4,652,812 | 3/1987 | Gimpleson et al. | 324/719 |
| 4,739,258 | 4/1988 | Schwarz | 324/537 |
| 4,743,847 | 5/1988 | Frushour | 324/158 R |
| 4,835,466 | 5/1989 | Maly et al. | 324/158 R |
| 4,837,502 | 6/1989 | Ugenti | 324/537 |
| 5,087,874 | 2/1992 | Robinson | 324/523 |
| 5,162,742 | 11/1992 | Atkins et al. | 324/523 |
| 5,172,063 | 12/1992 | Munikoti et al. | 324/537 |

OTHER PUBLICATIONS

IBM Technical Disclosure Bulletin vol. 23, No. 9, Feb. 1981 Circuit Board Testing Meier.
IBM Technical Disclosure Bulletin vol. 23, No. 9, Sep. 1981 Testing Printed Circuitry.

Primary Examiner—Maura K. Regan
Attorney, Agent, or Firm—Baker, Maxham, Jester & Meador

[57] ABSTRACT

A method for detecting and locating constrictions in electrical conductors of predetermined normal cross-section. A test or reference resistance reading is made and stored pursuant to application of a test current, a stress current is applied, heating any constriction in the conductor, a resistance reading is taken immediately after the heating has taken place and the respective resistance readings are compared to determine the presence or absence of a constriction or weak spot. The disclosure also includes an exemplary circuit to implement the method. In an alternative embodiment, a second test current is applied immediately after the stress current.

28 Claims, 8 Drawing Sheets

ADIABATIC CONDUCTOR ANALYZER METHOD AND SYSTEM

BACKGROUND OF THE INVENTION

1. Field of the Invention

This invention relates generally to a method for finding geometric conductor cross-section weak spots, and, more particularly, an adiabatic method for heating the conductor and measuring the electrical resistance of the heated element.

2. Description of the Related Art

In the manufacture of printed circuit boards, whether monolithic or multi-layered, quality depends upon the conductive integrity of the circuit traces as well as the plated-through holes in the circuit boards. The same considerations apply to discrete electrical conductors, or wires, and any other electrically conductive path of which one might conceive. The manufacturing process occasionally results in one or more conductors having areas of reduced cross-section while maintaining conductive continuity. The problem with constrictions or "neckdowns" is that as a circuit board or card is handled, or as it experiences thermal cycles, is powered on and off, or otherwise stressed, the constriction can result in a defect such as an open circuit, often many months or even years after the circuit board is put into operation.

Many attempts have been made to detect and locate such conductor constrictions so that a circuit card can be repaired because in an extreme case such a constriction would likely lead to breakdown at some future time. An example is U.S. Pat. No. 5,172,063 to Munikoti et al., which discloses a method and apparatus for testing for metal integrity by heating the defect until its support, the glass epoxy substrate itself which surrounds a plated-through hole, changes from a solid to a semi-solid state, resulting in a permanent change in conductor resistive value after cool down. Several cycles of heating and cooling are conducted, with resistance measurements being made after each cooling cycle. The measured resistance is compared with an expected resistance value so that a non-expected result indicates that a defect is present in the network of plated-through holes and interconnecting conductors which are included in the conductive path being tested. This patent contemplates the cycle time to be approximately ten minutes.

Several other examples of attempts to determine weak spots in electrical circuitry are reflected in U.S. Pat. Nos. 3,396,335 to Burr et al., 4,213,087 to English et al., 4,743,847 to Frushour, 4,835,466 to Maly et al., and 5,162,742 to Atkins et al. These patents are exemplary of the directions the prior art has taken to accomplish the desired result of locating potentially defective circuit traces and plated-through holes.

Some of the above patents are examples of non-linear current (NLC) testers, which do not heat the conductor under test but appear to employ a skin effect resistivity method. High current pulser testers, another type, generally are destructive in that the purpose is to "blow out" the weak spot so that it can be found and repaired. Optical tests have also been employed, but these have limitations, among them being a high potential for operator error, a requirement for significant operator training, and the inability to spot internal trace defects in multilayer boards. Other limitations of these methods include being significantly time-consuming, and some are limited to testing for shorts only or being otherwise limited in the value of the tests they conduct.

SUMMARY OF THE INVENTION

Broadly speaking, this invention relates to a method for locating constrictions in electrical conductors. A primary purpose of the invention is to provide a rapid conductor geometric flaw locating and identification ability on circuit cards, boards, cables, and plated-through holes (PTH), among others. The benefit of such a test is to facilitate prevention of early life failures of such electrical conductors. The rationale behind the method of this invention is that previous conductor constriction testing methods and apparatuses had significant disadvantages. They either took too long, so that relatively few production samples could be tested, they burned out the faults, or they had other drawbacks as previously mentioned.

The invention more particularly comprises the steps of measuring the electrical resistance of a length of conductive material in an unstressed condition, stressing the conductor with a sufficiently high current to cause heating of any significantly constricted portion of the conductor, quickly measuring the resistance after the heating step and before significant cooling has taken place, and then subtracting the two resistance measurements, the difference being a measure of the extent of the constriction.

An important aspect of the invention is that it is an adiabatic process. After the test current has been applied and the non-stressed resistance measurement made, the stress current is then applied and the subsequent resistance measurement is made immediately thereafter so that no significant amount of heat in the conductor has dissipated by the time the stress resistance measurement is made. In an alternative embodiment, a second test current is applied immediately after the stress current to ensure that there is no significant heat dissipation before the stress measurement is made. This is particularly useful when the substrate is relatively more thermally conductive than standard boards.

The method may be accomplished by several different means. One example of the circuitry is disclosed, together with sample calculations showing the efficacy of the process.

BRIEF DESCRIPTION OF THE DRAWING

The objects, advantages and features of this invention will be more readily understood from the following detailed description, when read in conjunction with the accompanying drawing, in which.

DESCRIPTION OF THE PREFERRED EMBODIMENTS

Figure 1:
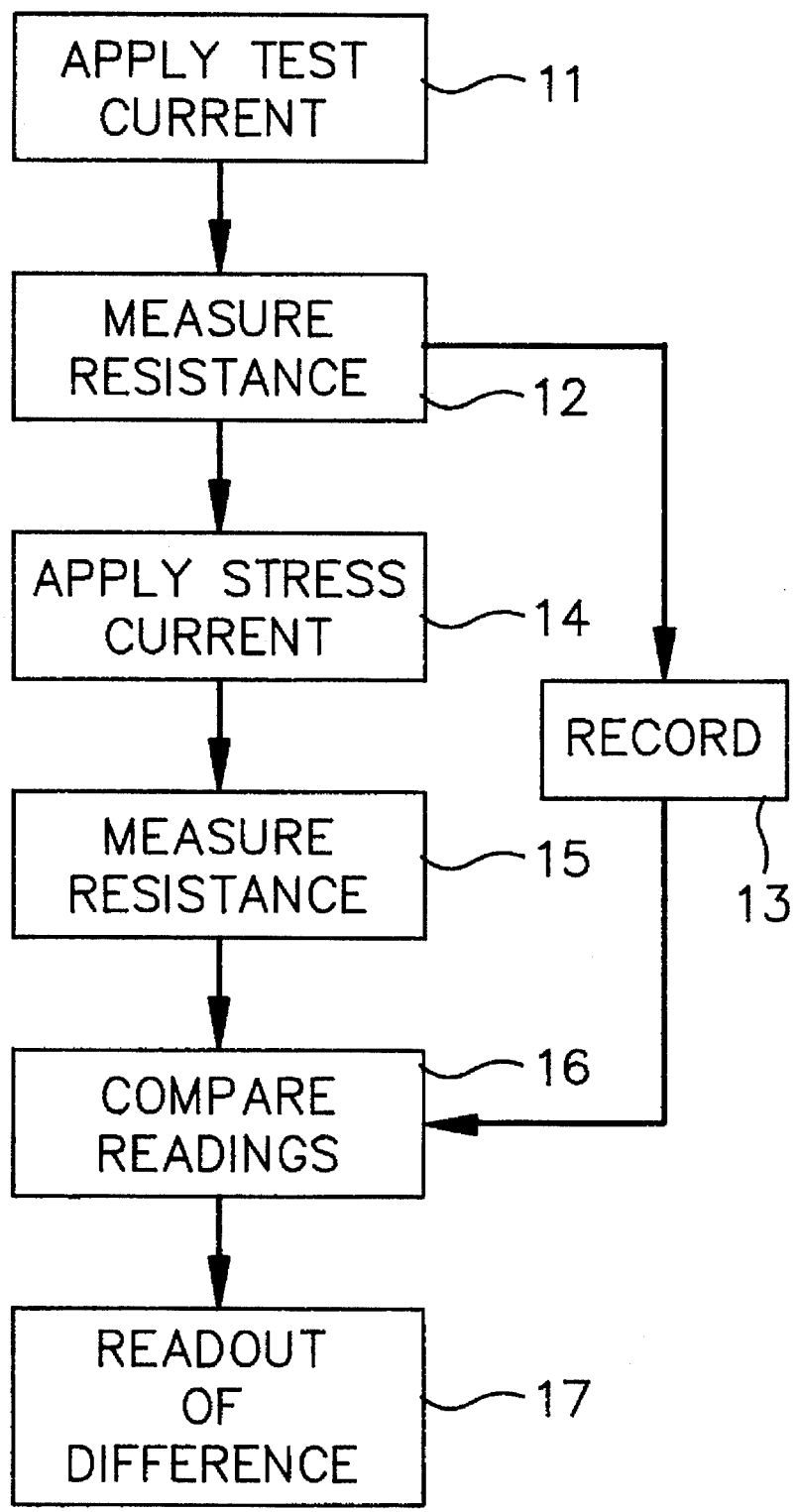
FIG. 1 is a flow diagram of the process of the invention.

With reference now to the drawing, and more particularly to the flow diagram of FIG. 1, the invention is shown in basic form by means of the steps of the process. In order to establish a reference or unstressed resistance value, a relatively low test current is applied as indicated by step 11 and the resistance is measured by means of a fast measurement acquisition ohmmeter in step 12. That resistance measurement is recorded in step 13 for later comparison. The next step is to apply a much higher stress current to the conductor under test as indicated in step 14. In the presently preferred embodiment, the test and stress currents are in the form of short duration electrical pulses. The resistance of the stressed conductor is measured as indicated in step 15 and the readings from steps 13 and 15 are compared in step 16, the difference readout appearing as represented by step 17. A significant difference indicates the existence of a constriction or weak spot. The actual values of the test and stress currents and a meaningful difference reading will vary depending upon the cross-section of the conductor and the material from which it is made. A person of ordinary skill in the art, with the teaching here, would be able to easily adjust the current levels necessary to accomplish the process of the invention.

Figure 2:
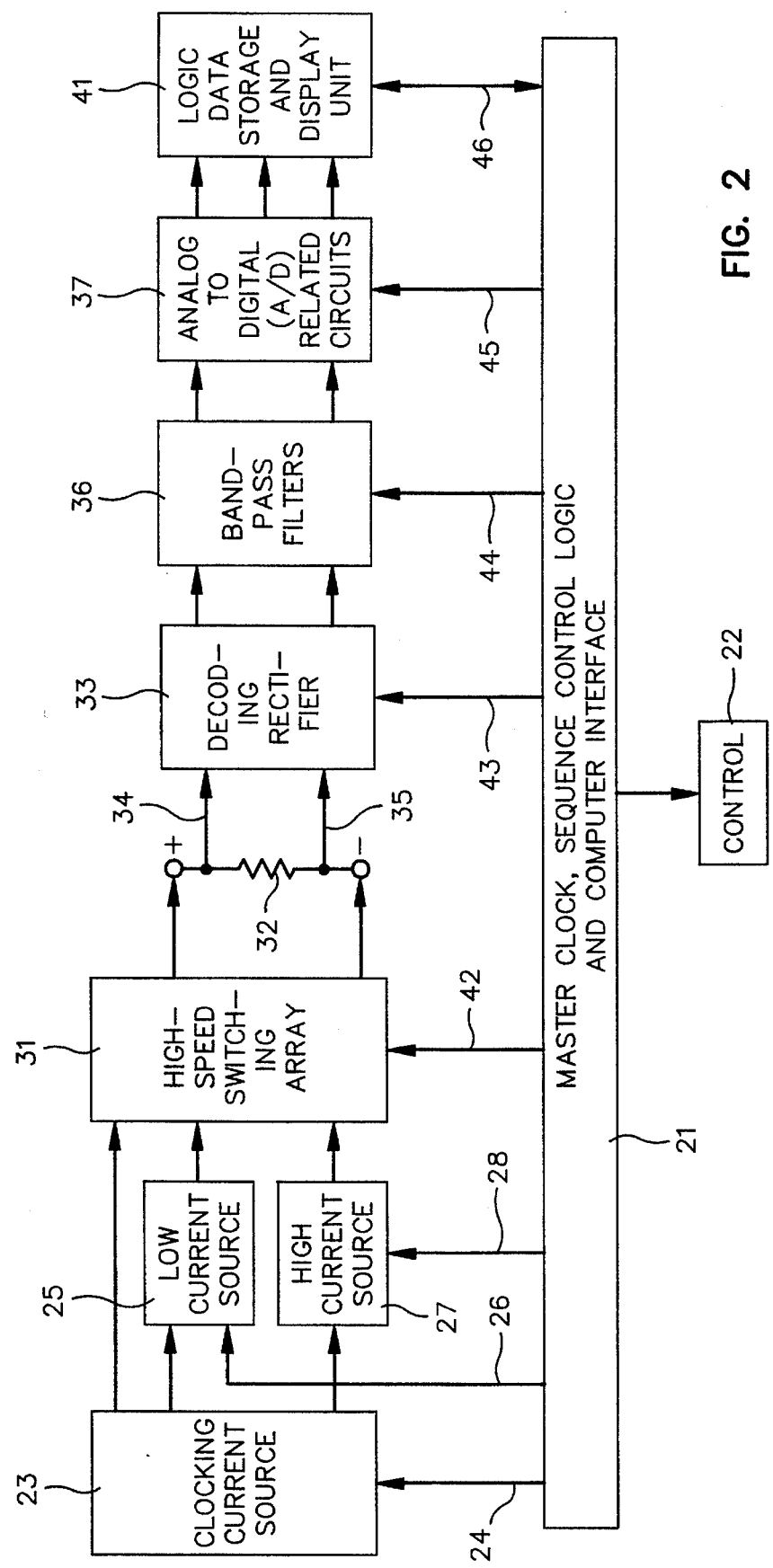
FIG. 2 is a block diagram of one possible system for implementing the process.

A system for accomplishing the process of FIG. 1 is shown in FIG. 2. Operating means or interface 21, which is subject to control 22, sequences and controls the operation of the other functional elements shown in the drawing. Control 22 is preferably a computer but it could be a manual control to commence the operation of the testing procedure. Signals from interface 21 are applied to clocking current source 23 through line 24. Other signals are provided to low current source 25 through line 26 and to high current source 27 through line 28. The outputs of these current sources are applied to high speed switching array 31, the output of which is connected to conductor 32, which is the line under test. Switching array 31 functions as a gate for the signals being applied to the subject electrically conductive element. The voltage across the line under test is applied to decoding rectifier 33 through lines 34 and 35 connected to either side of conductor 32. The output of the rectifier is coupled to bandpass filters 36, then to analog-to-digital (A/D) circuits 37 and then to logic data storage and display unit 41. All of these elements are subject to control signals from interface 21 as indicated by arrows 42, 43, 44, 45, and 46.

Rectifier 33 may be a synchronous decoder. It rescales the voltage across conductor 32 and the current through it, thereby providing a voltage output by performing the function E=IR. There are no physical ohmmeters in this exemplary circuit. The function of filters 36 is to clean up and isolate the desired signal information from noise and any other extraneous signal artifacts. A/D circuits 37 include statistical sample and hold circuits. It is contemplated that there will be several sample and hold circuits, eight being an example, whose outputs are added and averaged. This averaging process serves to further reduce inaccuracies that could result from a single reading. The A/D related circuits also include the comparator function. This is a high precision circuit. It should be noted that the actual values of the resistance readings are not important. It is important that the resistance readings be precise in that they are consistent and under identical circumstances, unvarying. The resolution precision is in the output of the comparator, which must have microvolt accuracy because the recorded and displayed result, when a fault or constriction is present, is measured in microvolts per mil of conductor length. This permits the process of this invention to provide a reading which enables the operator to determine the physical size of the conductor fault without a microscope.

Figure 3:
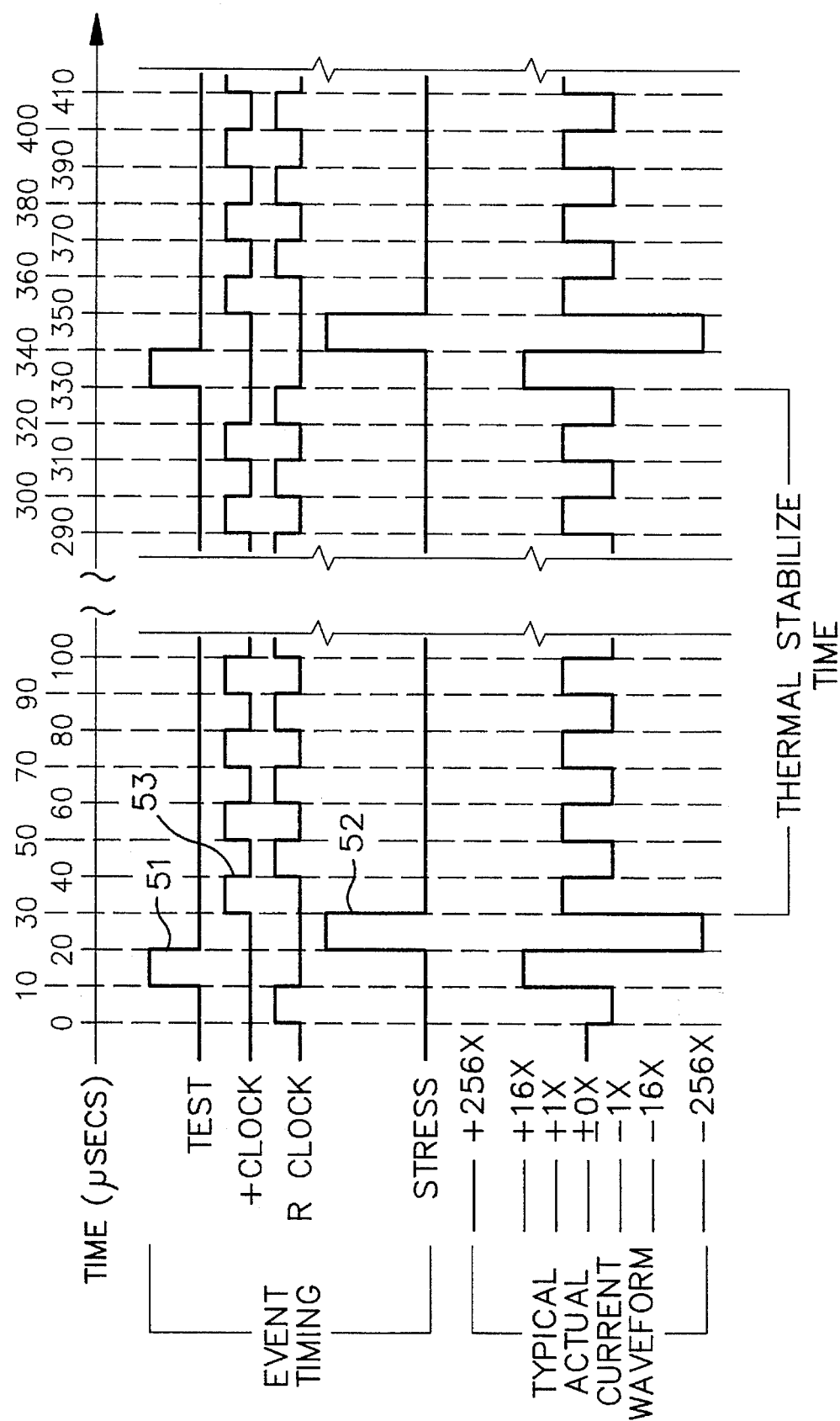
FIG. 3 is a pulse timing diagram as might be employed by the circuit of FIG. 2.

From the FIG. 3 example, it is noted that low level clock pulses are applied every 10 μsec for a 10 μsec duration. This is a model only but will serve to illustrate the invention. As shown in FIG. 3, a 10 μsec test pulse 51 from the low current source 25 is applied to test conductor 32 at a beginning cycle time such as t=10 μsec. At the end of this 10 μsec duration pulse, a much greater amplitude stress or heat pulse 52 is applied to the test conductor through high current source 27. The rectifier, filters, and A/D circuits all function to make immediate measurements at the end of each test and heat pulse to provide readings of resistance of conductor 32 both before and after the stress current is applied. The system then settles back to a series of carrier-type clock pulses 53. Relative amplitudes of these pulses are represented in FIG. 3 with the 10 μsec spaced 10 μsec width clock pulses being at a level of 1, the test pulses being at a level of 16, and the heat pulses being at a level of 256. These are only examples of ratios and are not intended to be any absolute current measurement or even a specific ratio. The actual pulse widths of the signals generated by the system would be optimized for the configuration and conductor current handling characteristics. They may, for example, range between 10 μsec and 100 μsec. Thus, the pulse amplitudes, the pulse widths and the repetition rate of the clock pulses produced by the master clock are determined by the parameters of the conductive material being tested. The capabilities of the rectifier, filters, and A/D circuits are tailored to accommodate these signal characteristics. More details of the possible parameters to be considered are shown in Tables 1, 2 and 3 below.

Pulse durations of 10 μsec to 100 μsec are preferred for several reasons. Precision high current sources (above 5 amps) are very expensive because the circuitry needed therefor is large and expensive. The shorter the duration, the higher the current that is required. A small, high performance adiabatic conductor analyzer according to the invention would likely have a pulse width range of about 25 μsec to 100 μsec. For example, a stress current of 14 amps for 10 μsec would effectively equal 7 amps, and for 20 μsec would effectively equal 3.5 amps. With a 3 ohm resistance to test, 14 amps would force 42 volts, but with 3.5 amps it would force 10.5 volts. If this analyzer were used on a bench unit with a hand probe, a lower current with longer pulse duration provides a safer voltage for the operator to handle. A manual bench setup does not require speed, whereas an automated tester is designed for speed of test operations.

Related pulse amplitudes depend on the type of testing system being used. For an automated system the test current might be in the range of 5 volts while the stress current could be in the range of 50 volts. For a manual system the test current might be around 4 volts and the stress current around 10 volts. The automated system would display the desired data while the manual system would indicate GO/NO GO.

Figure 4:
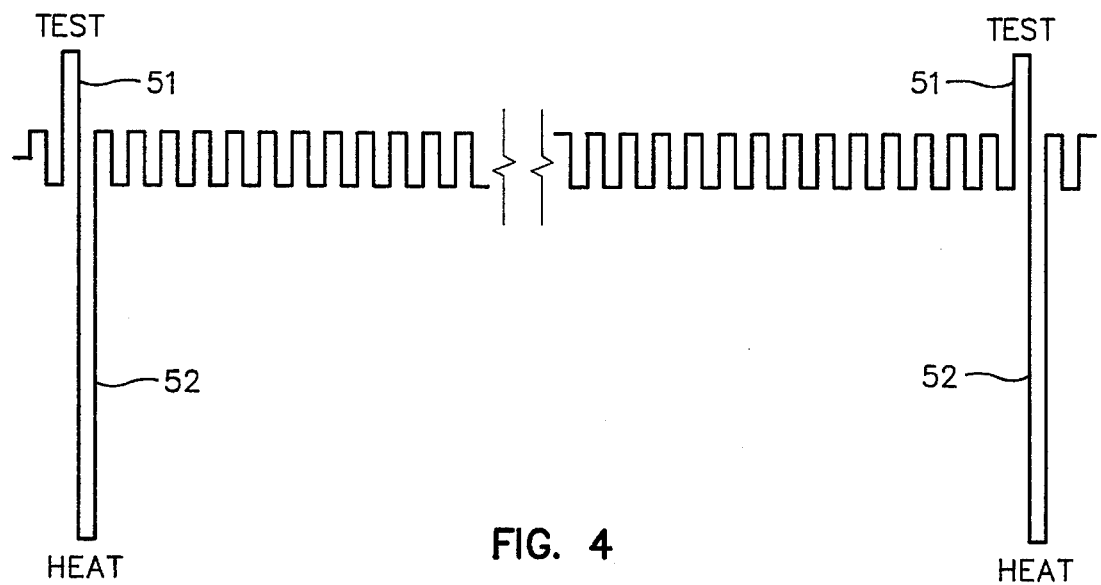
FIG. 4 is an expanded pulse timing diagram showing slightly more than one complete cycle.

A more visually accurate representation of one cycle of operation is shown in FIG. 4, where the relative amplitudes of the pulses are somewhat more graphic. The number of low-level clock pulses could be any appropriate number which would enable several test cycles to be conducted per second. For example, if it were desired to have 40 test cycles per second, there would be 1250 clock pulses between each test and heat pulse set or measurement cycle. At the same time, the time between measurement cycles must be sufficient to allow the increased temperature of the constriction to diminish back to or near the starting temperature. One advantage to continuing with low-level clock pulses through the system during the temperature settling time is that when electric wave filters are used in the measurement circuit represented by block 36 the circuit remains stabilized, whereas it could be less stable if the measurement circuit were allowed to go completely quiescent between measurement cycles.

Not all constrictions are actually weak spots which need preventive attention. A weak spot constriction is considered to be no more than 25 percent of the established or predetermined cross-section of the conductor. Of course, the established cross-section may vary substantially for different applications and for different materials. The test system can be tailored to the characteristics of the conductors being tested, including types of material, which relates to conductivity, and predetermined cross-section. A weak spot of 0.001 inch in length in 10.000 inches of conductor would result in a flaw reading about 0.01 percent of conductor resistance, due to how wide the flaw is. This, as previously stated, requires high resolution readings for the resistance measurements so that the critical value, the difference between the resistance measurements, is accurately determined. With the parameters stated above, for a 10.000 ohm conductor, it would show up to 0.001 ohm for each 0.001 inch of weak spot length, depending on the width of the weak spot.

Because the constriction or weak spot measurement is so small, the circuitry embodiment discloses the use of a carrier-type analog system so that electronic circuit noise can be reduced significantly, thereby permitting the extremely small signals to be detected. In order to make this an adiabatic-type test process, a high current is used to heat the weak spot and the measurement is taken immediately at the end of the stress current pulse (the heat pulse) so that there is no effective thermal dissipation between the end of the heating cycle and the measurement of the resistance of the heated conductor. After each heat pulse, there is a "wait time" to allow weak spot heat dissipation. It is during this process that very low current clock (carrier) pulses are passed through the conductor under test, essentially marking time while the heat is dissipating. Heavier or larger cross-section conductors require longer dissipation times due to larger thermal injection resulting from the heating current pulse.

In developing this invention, it was found that analog-to-digital technology ideally suited to be employed with this system is of the type developed for compact laser disc or digital audio systems. These provide the very high resolution, high speed analog-to-digital converters necessary which have been developed for studio professional digital audio recording equipment with carrier-type amplifier and rectifier, with electric wave filters for reduced noise levels to reduce noise to microvolt levels.

To further expand upon the explanation of the FIG. 2 circuit combination, the high and low current source elements, the switching array, the rectifier, filters, and A/D circuits effectively incorporate two special fast measurement acquisition ohmmeters, one having a precision scaled low test current and the other having a precision scaled high test current. The ratio of the two test currents is established with respect to each other so that the ohms' voltage of one can be scaled to match the other while testing a good circuit conductor. This means that the output circuitry of FIG. 2 indicates a substantially zero difference when line 32 is good, that is, does not have a weak spot within the stated parameters.

Upon completion of one measurement cycle of a test pulse and a heat pulse, if the two resistance measurements do not match, the difference is the adiabatic indicator of constriction or neckdown. The resistivity is increased due to the heating up of the constricted portion of the conductor resulting from the stress of the high current applied pulse. "High current" as applied here is intended to mean much higher than the test or unstressed pulse but generally much lower than would be required to burn out the weak spot. This is a significant difference from some of the prior art testers, which apply a very large pulse that actually causes an open circuit by burning out the weak spot.

Figure 5:
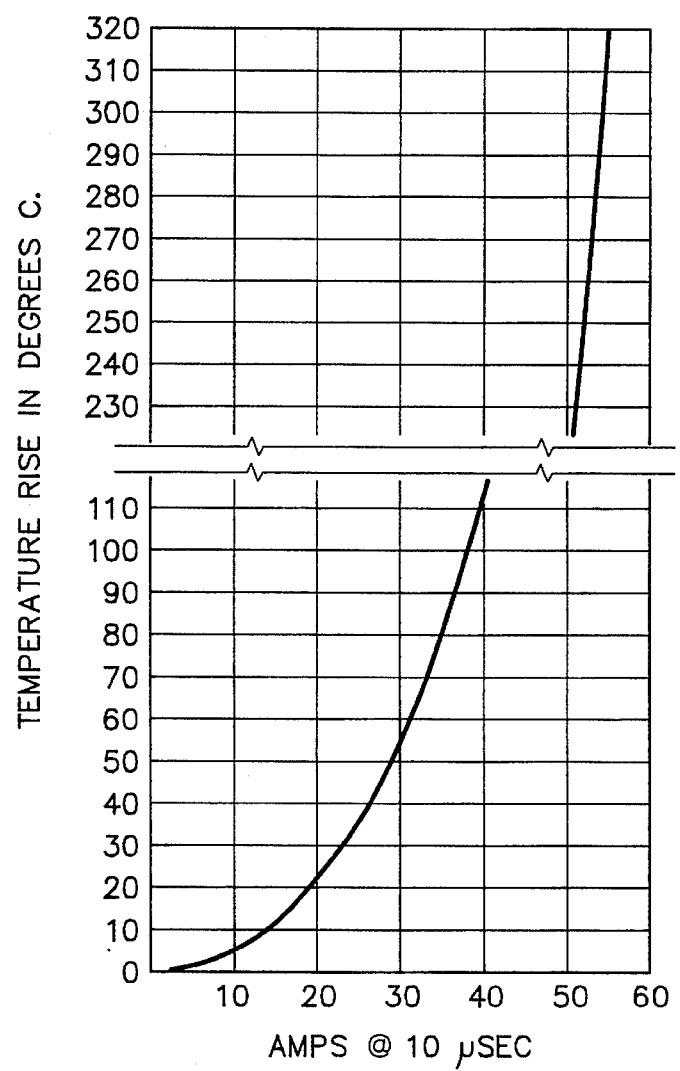
FIG. 5 shows a graph of temperature increase versus current for the process of the invention.
Figure 6:
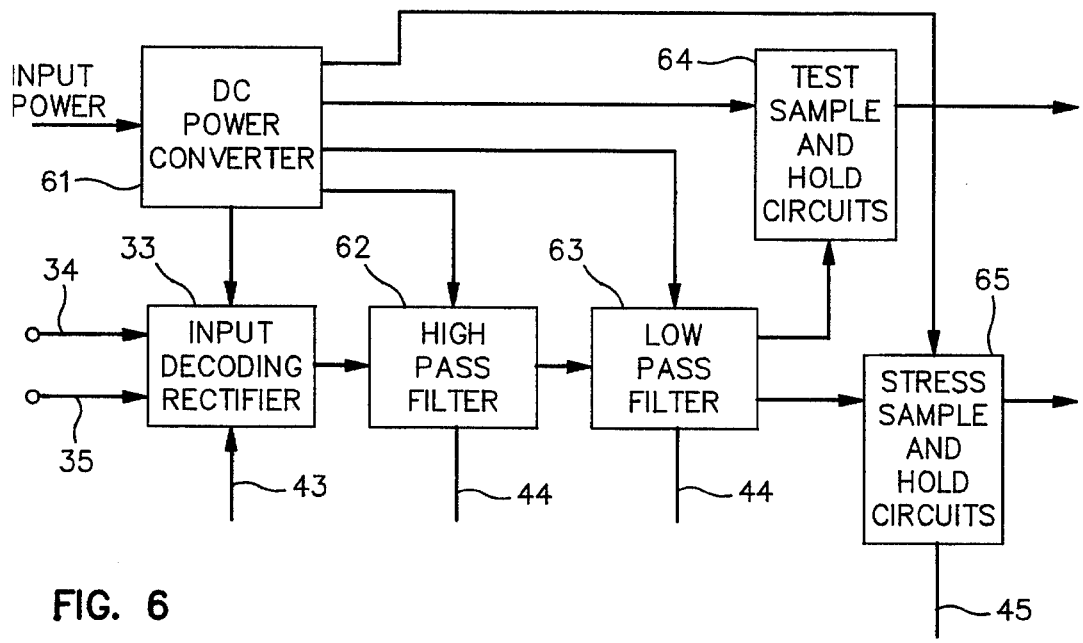
FIG. 6 is a more detailed block diagram of a typical example of the sensing circuitry of FIG. 2.

With reference now to FIG. 5, a specific example of a weak spot detection in accordance with the method of the invention will be described, together with the calculations involved. Certain basic parameters or assumptions are established, from which, together with parameters from reference tables, specific exemplary determinations can be made.

REFERENCE ASSUMPTIONS

1. Depending upon substrate material, printed circuit line to substrate thermal transfer is typically 10 μsec to 200 μsec.

2. Test and heat pulses 10 μsec in width are used in this example.

3. A typical copper circuit line of 6 inches long, 0.004 inches wide and 0.0014 inches thick, resulting in a cross-section of 5.6 ($10^{-6}$) square inches, is used.

4. The conductor under test has a weak spot 0.006 inches long, 0.001 inches wide and 0.0014 inches thick. Thus the length is 1/1000th the length of the conductor being tested and the neckdown is 25 percent of the predetermined width of the conductor.

5. There is a 10° C. rise in temperature of the weak spot in the conductor resulting from the heat pulse.

FROM REFERENCE TABLES

1. A copper conductor with a cross-section of 5.6 ($10^{-6}$) square inches is equivalent to a #41 awg wire. A #41 awg wire has a resistance of 1.323Ω per foot so that a 6 inch length has a total resistance of 0.6615Ω. Alternatively, it is possible to determine the resistance directly from the resistivity of the copper used which can be slightly different. The end result would be very close to the same. Resistivity figures are available for particular circuit cards. They may differ between vendors.

2. The specific heat of copper is 0.092 Cal/g/° C. This means that a 10° C. temperature increase calculates to 0.92 Cal/g/10° C.

3. To convert cubic inches to cubic centimeters ($cm^3$), multiply by 16.387.

4. To convert Calories to watt-sec, multiply by 4.184.

5. The density of copper is 8.94 grams per $cm^3$.

EXAMPLE CALCULATION

1. The resistance of the unstressed neckdown portion of the 6 inch conductor, is $$\Omega = \frac{\text{total line resistance} \times \text{the resistivity of the fraction of the cross-section}}{\text{the fraction of line length}}$$

Applying the above parameters:

$$\frac{0.6615 \, \Omega \, (4)}{1000} = 0.002646 \Omega.$$

2. The constriction volume is:

$$v = \frac{\text{predetermined line cross-section} \times \text{constriction length}}{\text{the resistivity of the fraction of line cross-section}}$$

$$v = \frac{5.6(10^{-6})(6)(10^{-3})}{4} = 8.4(10^{-9}) \text{in}^3$$

$$8.4(10^{-9})\text{in}^3 \times 16.387 = 1.3765(10^{-7})\text{cm}^3$$

3. Constriction weight in grams: $w = 1.3765(10^{-7})\text{cm}^3 (8.94) = 1.2306(10^{-6})\text{g}$ 4. Calories required for 10° C. rise in constriction temperature: $C = 0.92(1.2306)(10^{-6})\text{g} = 1.1322(10^{-6})\text{Cal}$ 5. Power required for 10° C. rise in watt-sec: $p = 1.1322(10^{-6})\text{Cal}(4.184) = 4.737(10^{-6})$watt-sec 6. The constant current required for 10 μsec for 10° C. temperature rise of the constriction:

$$I = \sqrt{\frac{\text{watt-sec}}{\Omega \times \text{time}}}$$

$$I = \sqrt{\frac{4.737(10^{-6})}{2.646(10^{-3})(10^{-5})}} = 13.38 \text{ amps for 10 μsec duration}$$

This indicates that for this particular set of parameters for this particular example, a constant current of 13.38 amps for 10 μsec will stress a 0.001 inch wide constriction sufficiently to increase its temperature by 10° C., thereby resulting in an increased total resistance of the tested 6 inch long conductor. Applying the above information to the test conductor results in the following calculations.

1. To determine the total unstressed line resistance including the neckdown:

$$\begin{array}{c}\text{total}\\ \text{line}\\ \text{resistance}\end{array} - \begin{array}{c}\text{the}\\ \text{equivalent}\\ \text{resistance}\\ \text{of the}\\ \text{constriction}\end{array} + \begin{array}{c}\text{the}\\ \text{actual}\\ \text{constriction}\\ \text{resistance}\end{array} = \begin{array}{c}\text{the}\\ \text{unstressed}\\ \text{line}\\ \text{resistance}\end{array}$$

Resistance = 0.6615 − 0.0006615 + 0.002646 = 0.6634845 Ω

2. Total line resistance with 10° C. rise of the constriction, assuming the resistance of copper increases with temperature at 0.004 Ω/Ω/° C.:

$$\begin{array}{c}\text{temperature}\\ \text{resistance}\\ \text{factor}\end{array} \times \begin{array}{c}\text{constriction}\\ \text{resistance}\end{array} + \begin{array}{c}\text{unstressed}\\ \text{line}\\ \text{resistance}\end{array} = \begin{array}{c}\text{stressed}\\ \text{line}\\ \text{resistance}\end{array}$$

Resistance = 0.004(10)(0.002646) + 0.6634845 = 0.6635903 Ω

This would result in a normalized voltage reading at the output of the process, that is, the difference between the test reading and the stress reading, as follows:

$$R_{stress} \times I - R_{test} \times I = E$$

$$E = 0.6635903(13.38) - 0.6634845(13.38) = 0.0014156 \text{ volts}$$

While this is a very small difference reading, the circuitry of FIG. 2 is an example of a means for obtaining that difference. This circuit can make consistent and accurate measurements of the resistance for each part of the test cycle and provides a highly precise difference between those readings. This difference is the measure of the extent of the neckdown or constriction in the conductor.

The block and circuit diagrams of FIGS. 6–12 are provided to show somewhat more detailed examples of some of the components in the FIG. 2 block diagram. Components 33, 36 and 37 of FIG. 2 are further depicted in FIG. 6. DC power converter 61 supplies power to rectifier 33, to high and low pass filters 62 and 63, and to test and stress sample and hold circuits 64 and 65, respectively. The power converter and rectifier are conventional components.

Figure 7:
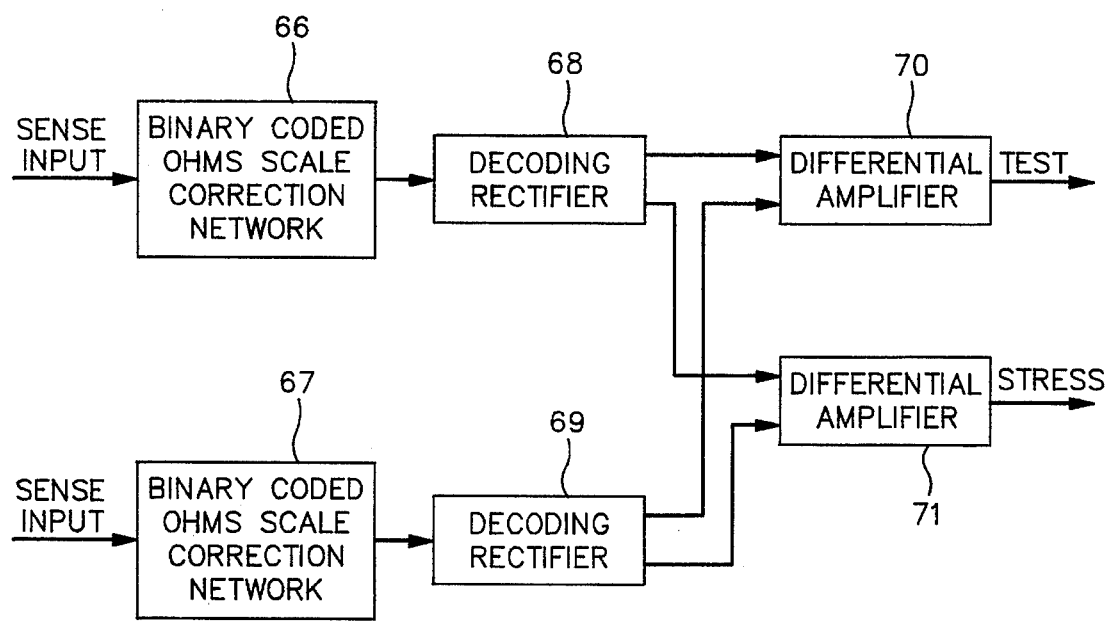
FIG. 7 is a more detailed block diagram of the decoding rectifier of FIG. 2.

The decoding rectifier is shown in more detail in FIG. 7. A series of resistors in correction networks 66 and 67 can be programmed for different current levels from 0.8 to 12.8 amps as shown under Heat Current column in Table 1 below. In this Table, the high current values are coded in binary. The outputs of the correction networks are applied to decoding rectifiers 68 and 69, with their outputs being connected to differential amplifiers 70 and 71. Test and stress outputs are then connected to the filters.

Figure 8:
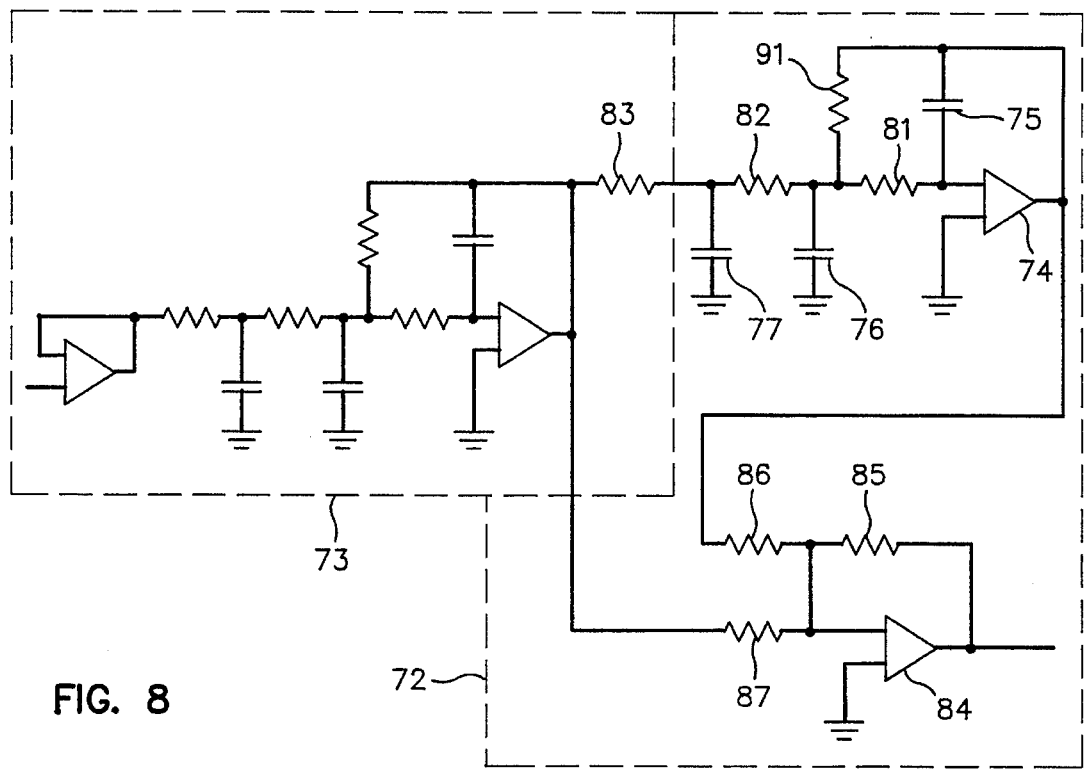
FIG. 8 is a schematic diagram of the low pass and high pass filters as a bandpass unit useable in FIG. 2.

FIG. 8 shows an example of low pass and high pass filter circuitry as a bandpass unit. Filter section 72, which has a low pass at 100 Hz, for example, provides high pass with pass band gain accuracy. It should be noted that standard high pass filters do not have pass band gain accuracy, primarily due to capacitor tolerances. Filter section 73 has a low pass at 100 kHz.

Amplifier 74 is a device sold under the designation OPA 627. Capacitor 75 has a value of 0.03 μf, capacitor 76 is 0.33 μf, and capacitor 77 is 0.39 μf. Resistors 81, 82 and 83 are each 10 kΩ. Of course these values are examples only and different values can be chosen. The person of ordinary skill in this technical field would readily be able to build, test, and operate this circuitry. Further component values are here provided for purposes of completeness. Amplifier 84 is similar to amplifier 74. Each of resistors 85, 86, and 87 has a 10 kΩ resistance. Resistor 91 has a 20 kΩ value. The equivalent circuit elements in filter section 73 have the same values.

Figure 9:
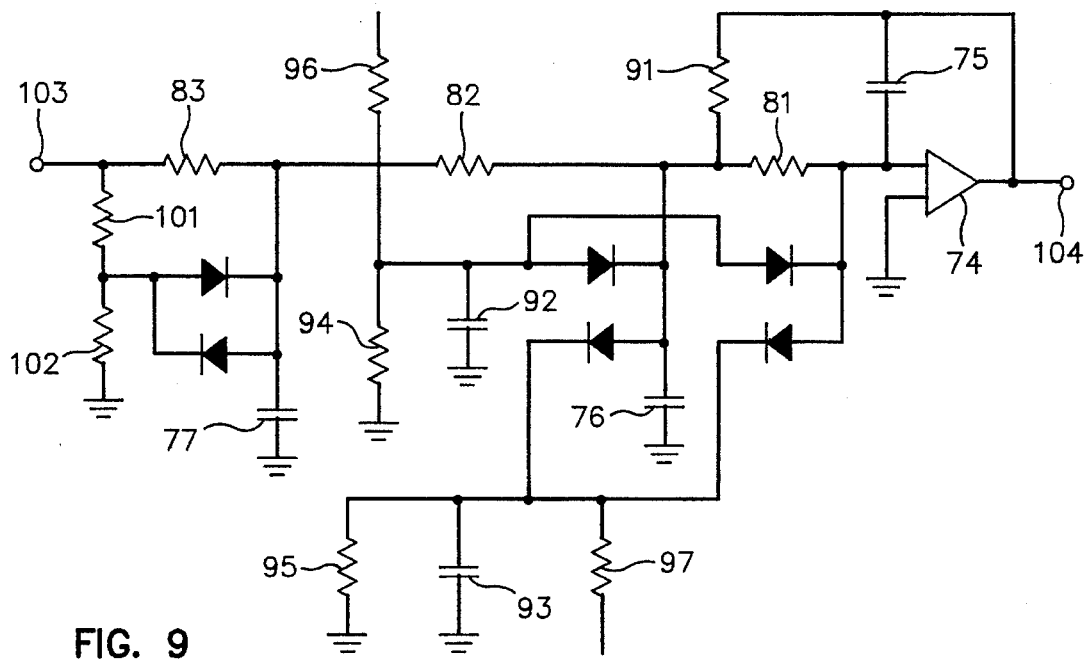
FIG. 9 is a more detailed circuit diagram of the low pass filter of FIG. 8.

The non-linear low pass filter of FIG. 9 is an expansion of one of the filter sections of FIG. 8. This filter is characterized by being fast settling and having a 0.005% gain accuracy. It is a filter stage low pass using a Butterworth function. The diodes are IN914's. Capacitors 92 and 93 are 10 pf elements, resistors 94 and 95 are 360Ω each, while resistors 96 and 97 are 15 kΩ each. In a specific embodiment, resistors 101 and 102 have values of 1,072Ω and 928Ω, respectively. The filter stage of FIG. 9 has an overall gain of −1, so with a 10 volt input at 103, the output at 100 is −10 volts.

Figure 10:
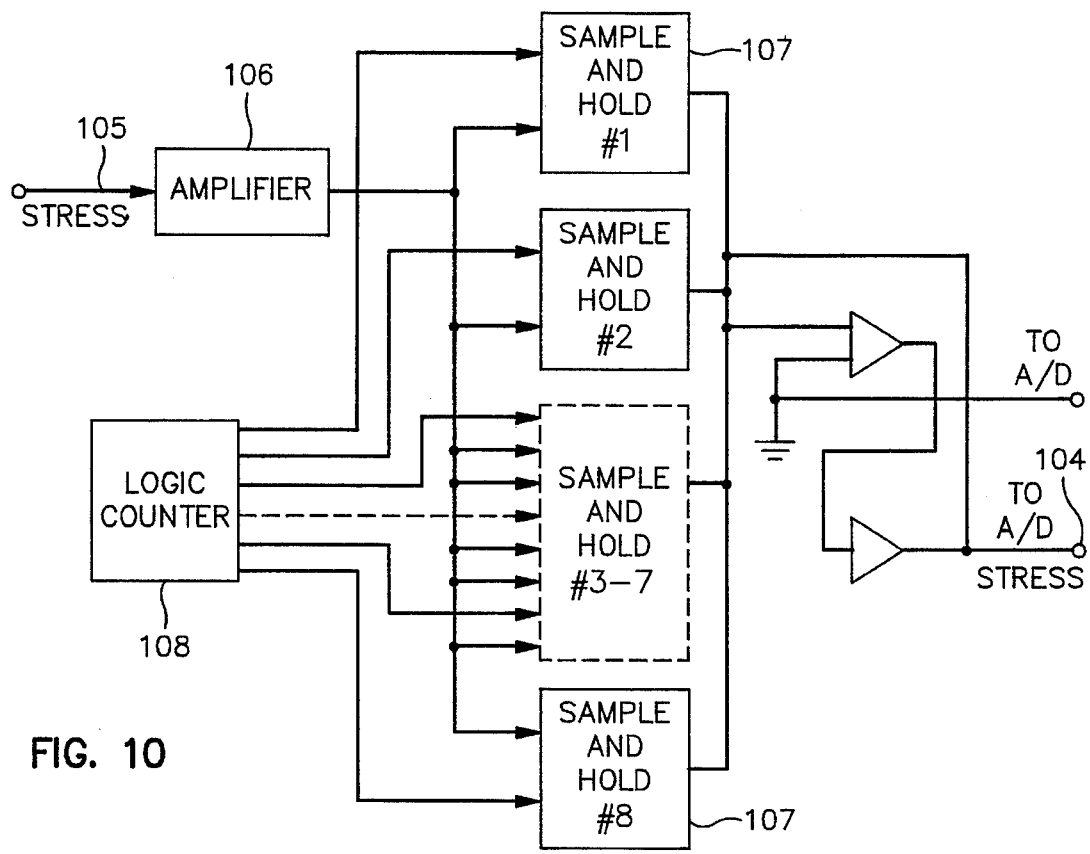
FIG. 10 is a schematic diagram of a GO/NO GO version of the sample and hold circuitry of FIG. 2.
Figure 11:
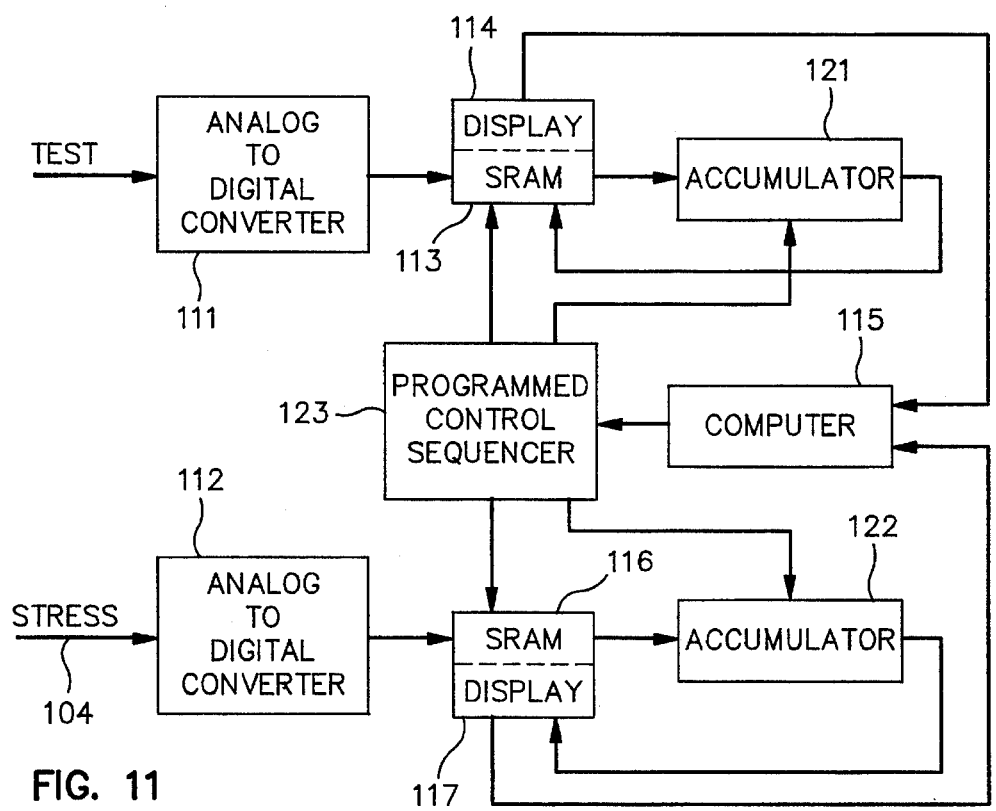
FIG. 11 is a block diagram of logic data storage and A/D related circuits of FIG. 2.

The analog-to-digital circuitry of FIG. 2 is shown in FIGS. 10 and 11. Stress input 105 to amplifier 106 provides inputs to a battery of sample and hold circuits 107. Here eight are shown. Logic counter 108 also provides pulse inputs to each sample and hold circuit. By means of this circuitry, eight consecutive complete measurement cycles are averaged. Because this is a GO/NO GO version, output 104 to the stress A/D circuit of FIG. 11 only means a constriction fault. The test signal would be applied to a circuit identical with FIG. 10, where it would provide the test input to FIG. 11.

Logic data storage and A/D related circuits of FIG. 2 are shown in the FIG. 11 block diagram. The test output of the circuit similar to FIG. 10 is applied to A/D 111 while the stress output of FIG. 10 is applied to A/D 112. The digital output of A/D 111 is applied to static RAM 113 which includes a digital panel display 114. The averaged contents of SRAM 113 are displayed and passed on to computer 115.

A/D 112 operates in similar manner with SRAM 116 and display 117. SRAM 113 operates in conjunction with accumulator 121 and SRAM 116 operates with accumulator 122. Programmed control sequencer 123, under control of computer 115, provides control signals to the SRAM's and the accumulators.

Figure 12:
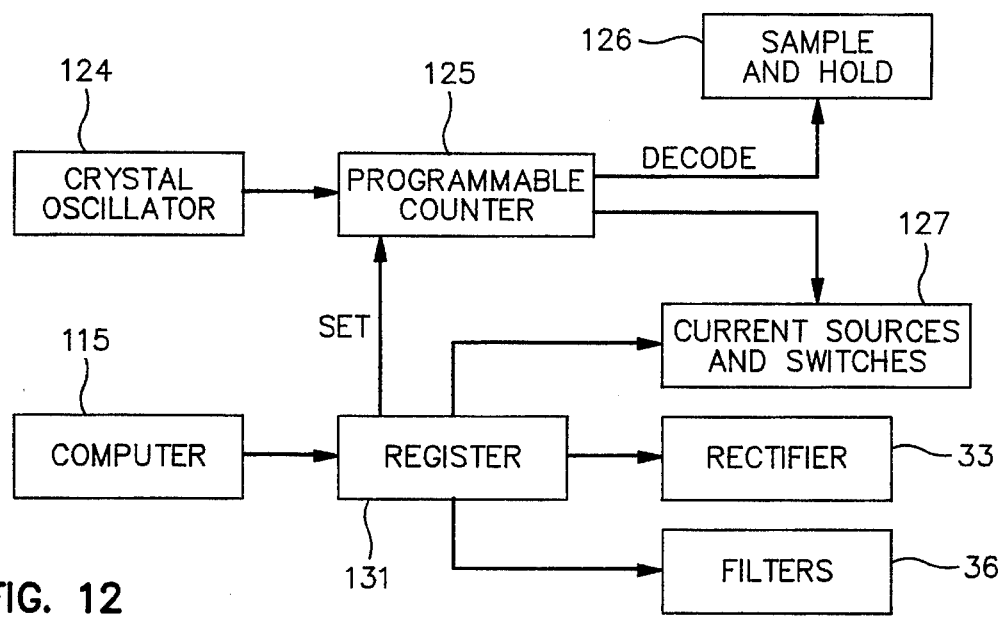
FIG. 12 is a block diagram of the master clock, sequence control logic and computer interface of FIG. 2.

The master clock, sequence control logic and computer interface 21 of FIG. 2 is shown in more detail in FIG. 12. Crystal oscillator 124 provides timing signals to counter 125 which sends "decode" signals to sample and hold timing circuit 126. Signals from the counter also go to the current sources and switches, represented by block 127. Signals from computer 115 are applied to register 131 which sends "set" signals to counter 125. Signals from the register also include range control signals to rectifier 33 and high and low pass frequency signals to filter 36.

The circuitry and details of FIGS. 6–12 provide exemplary implementations of appropriate means for accomplishing the method of the invention. There may be other ways in which to perform the method. There may be many specific components, other than those shown, which the person skilled in the art might employ in carrying out the method.

Since the heating or stress pulse of each cycle will result in a slight rise in the temperature of the whole conductor under test, multiple complete cycles may be conducted with time between each test cycle for nearly total thermal dissipation. The circuitry takes an average of the difference readings thereby all but completely eliminating any error which might be caused by the slight heating of the entire conductor. It has been found that 16 cycles per complete test will balance out substantially any such internal error. There is no actual requirement that several tests be conducted but extreme accuracy would suggest this would be appropriate, at least in some instances. There is also no requirement that 16 cycles be applied, as opposed to any other multiple number of cycles. Averaging cycles in this system increases measurement resolution due to "oversampling", for example, 16 readings averaged results in at least 4 times the resolution compared with a single reading.

The following Table 1 is a further example of actual parameters of different length pulses which might be applied in making measurements in accordance with this method. This may be thought of as a programming table, where the operator can program a combination of parameters to best suit the particular application. These are also by way of example only.

TABLE 1

| Test Current | Followed By | Heat Current | Pulse Width | High Pass Filter | Low Pass Filter | Number of Averaging Steps |
|---|---|---|---|---|---|---|
| 0.05 a | → | 0.8 a | 10 μsec | 1000 kHz | 100 Hz | 1 |
| 0.10 a | → | 1.6 a | 15 μsec | 500 kHz | 200 Hz | 2 |
| 0.20 a | → | 3.2 a | 20 μsec | 250 kHz | 400 Hz | 4 |
| 0.40 a | → | 6.4 a | 25 μsec | 125 kHz | 800 Hz | 8 |
| 0.80 a | → | 12.8 a | 40 μsec | 63 kHz | 1600 Hz | 16 |

This shows a 16-to-1 ratio for the heat current to test current. This is convenient for scaled ease in the decoding rectifier. Otherwise it could be any ratio of relatively high to relatively low current. Some of the considerations that enter into the operator's decisions on the parameters to use from Table 1 are: the thermal conductivity of the substrate; the conductivity of the conductor; the conductor geometry (flat trace, plated through hole); the desired testing speed (high current or averaging). For example, a narrow trace would permit low currents to be applied, while a PTH would require the higher applied currents. More detail is shown in the following Programming Logic Table.

TABLE 2

Programming Logic

| Higher Current Required For: | Slower or Wider Pulse Widths Used For: |
|---|---|
| Heavy copper lines | Heavy copper lines (2 oz to 5 oz) |
| Plated thru hole (where there is more metal) | Poor thermal conductivity substrate (Teflon, e.g.) |
| Fast testing desired | Personal safety |
|  | Limits of multiplexer switches/relays in system |
|  | High resistance conductors, e.g., 13Ω |

| Faster or Narrower Pulse Widths Used For: | Purpose of Averaging Steps: |
|---|---|
| Plated through holes | Increases test accuracy and resolution (if looking for line cracks less than 0.0002" in length, increase averaging steps) |
| High thermally conductive substrate, e.g., ceramic | |
| Line faults narrower in length than 0.001" (fastest thermal loss is lengthwise in copper) | |

Filters:

High pass at ⅛ of test frequency
Low pass at three times test frequency

With reference to Tables 1 and 2, an operator of the system has all of the parameters needed to perform the method of the invention. Examples of application data are shown in Table 3 below.

TABLE 3

Application Data

| Resistance of Line Under Test | Current (amps) | | Voltage Across Line (volts) |
|---|---|---|---|
| 10Ω | Stress | 12.8 | 128* |
|  | Test | 0.8 | 8 |
|  | Clock | 0.05 | 0.4 |
| 1Ω | Stress | 12.8 | 12.8 |
|  | Test | 0.8 | 0.8 |
|  | Clock | 0.05 | 0.04 |
| 0.1Ω | Stress | 12.8 | 1.28 |
|  | Test | 0.8 | 0.08 |
|  | Clock | 0.05 | 0.004 |

*At 12.8 amps the maximum resistance of the line under test, assuming no wiring losses, is about 3.6Ω.

A fully automated integrated system in accordance with this invention could function in conjunction with a test "bed of nails". A particularly configured array of pins (bed of nails) can be coupled with a particular circuit board to be tested where a computerized switching system can apply current between any two pins in the bed of nails. Thus, in sequence, all of the conductive paths, including printed circuit traces, plated-through holes, and any other leads or wires associated with the board, can be rapidly sequentially tested. The output display unit could also be a printout in any form, such as word or graphic form, of a partial or complete set of test results for any board. Visual digital or analog readings could also be provided. The implementation of such an automated system is not within the scope of this invention but indicates how this method lends itself to extremely rapid complete and automated testing of circuit boards.

Figure 13:
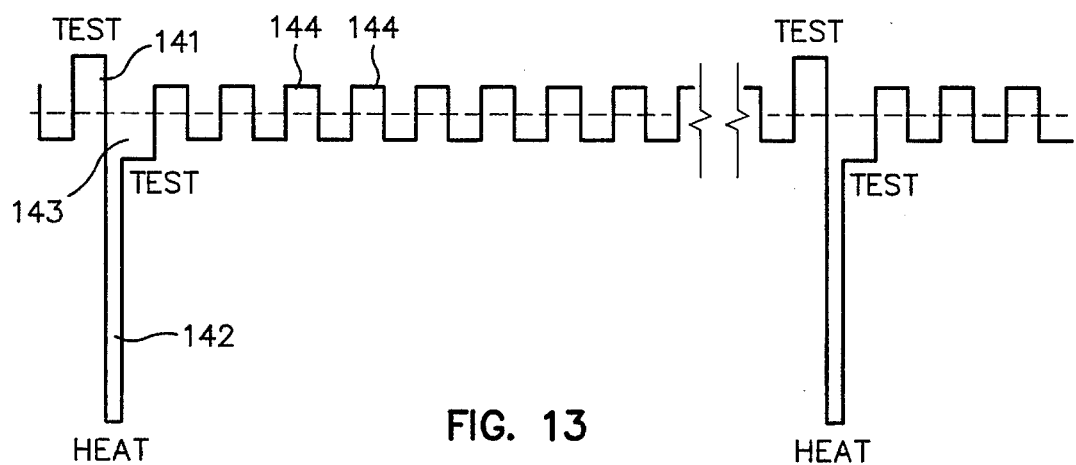
FIG. 13 is an alternative embodiment timing diagram similar to FIG. 4.

The timing diagram of FIG. 13 shows a modified version of the method of the invention. In FIG. 4 the test current is immediately followed by the stress or heat current. In this modified method, test current 141 is followed by fast stress current 142 followed immediately by second, inverted polarity, test current 143. This obtains a high resolution resistance reading before the heat can leave the fault, even when the substrate is relatively highly heat conductive. Clock pulses 144 continue during the heat dissipation period as before.

To accomplish this modification to the method, a change in resistor values in the FIG. 7 correction networks of the decoding rectifier to make the stress:test ratio (142:143) the same as the test:stress ratio (141:142) is required. Additionally, the polarity of the test current is switched for the normal interval of the stress pulse. High current 142 is placed between the two test currents 141 and 143. The pulse widths of test currents 141 and 143 are about 10 μsec while the stress pulse is about 2 μsec to 5 μsec in width. There is no difference in the clock pulses from that shown in FIG. 4.

Typical parameters of the FIG. 13 method are that the test current pulse is 0.4 amp at 10 μsec and the heat pulse is 20 amp at 5 μsec. Of course, modified Tables 1 and 2 would apply, making appropriate changes to accommodate different characteristics of the conductors and substrate. With respect to Example calculation 6 above, the test current would be 0.83625 amp at 10 μsec and the stress or heat current is 26.76 amp at 5 μsec.

In view of the above description, it is likely that modifications and improvements will occur to those skilled in the art which are within the scope of the accompanying claims. For example, as suggested previously, there are other ways for implementing the process in addition to the exemplary circuit of FIG. 2. The only requirements are that the implementing circuitry provide the test pulses followed by the much higher amplitude stress pulses, make appropriate and immediate measurements of the resistance values of the conductor under test, and provide the difference reading, all without stressing the constriction to destruction, and in very rapid order.

What is claimed is:

1. A method for locating constrictions in electrical conductors of predetermined normal cross-sections, the method comprising the steps of:

isolating a unitary length of conductive material;

applying a test current pulse to the isolated conductive material, the current level of the test pulse being sufficient to enable a resistance measurement to be made and being below the level necessary to heat the isolated conductive material;

measuring the electrical resistance of the isolated conductive material under unstressed condition;

storing the unstressed resistance value;

applying a stress current pulse to the isolated conductive material, the current level of the stress current pulse being much greater than the current level of the test current pulse, thereby causing heating of any constriction therein; thereafter adiabatically measuring the electrical resistance of the stressed isolated conductive material; and subtracting the unstressed resistance measurement from the resistance measurement under stressed conditions to determine a difference value.

2. The method recited in claim 1, wherein said steps of applying a test current pulse, measuring the resistance of unstressed isolated conductive material, applying a stress current pulse, measuring the resistance of the stressed isolated conductive material and subtracting the respective resistance measurements are repeated cyclically for a plurality of cycles and the difference values are averaged to improve difference value resolution.

3. The method recited in claim 1, wherein the stress current amplitude is several times greater than the test current.

4. The method recited in claim 1, wherein the test and stress current pulses range from 10 μsec to 100 μsec in duration.

5. The method recited in claim 4, wherein the current pulses are 10 μsec in duration.

6. The method recited in claim 2, wherein a multiplicity of complete, independent test cycles of applying test and stress current pulses and calculating the resistance difference values are conducted per second.

7. The method recited in claim 1, and comprising the further step of determining from the subtracted result whether the isolated conductive material includes a constriction which has a threshold cross-section less than the predetermined cross-section.

8. The method recited in claim 7, wherein the threshold cross-section is no more than 25 percent of the predetermined cross-section.

9. The method recited in claim 1, wherein said steps of applying a test current pulse, measuring the resistance of unstressed isolated conductive material, applying a stress current pulse, measuring the resistance of the stressed isolated conductive material and subtracting the respective resistance measurements are repeated cyclically for a plurality of cycles and the difference value are averaged to improve difference value resolution, the method comprising the further step of:

applying a multiplicity of circuit stabilizing clock pulses between sequential cycles of measurements, the clock pulses having an amplitude substantially less than the amplitude of the test current pulses.

10. The method recited in claim 1, wherein said unstressed condition measuring step comprises:

applying a test current pulse to the isolated conductive material;

reading and recording the resistance of the isolated conductive material pursuant to the applied test current; and applying a second test current pulse to the isolated conductive material immediately following the stress current application.

11. The method recited in claim 10, wherein the first and second test current pulses are of equal magnitude and the stress current pulse is several times higher in magnitude than the test current pulses.

12. The method recited in claim 10, wherein the first and second test current pulses range from 10 μsec to 100 μsec in duration and the stress current pulse ranges from 2 μsec to 5 μsec in duration.

13. A method for locating constrictions in electrical conductors of predetermined normal cross-sections, the method comprising the steps of:

isolating a length of conductive material;

applying a test current pulse to the isolated conductive material;

reading and recording the resistance of the isolated conductive material pursuant to the applied test current pulse;

applying a stress current pulse to the isolated conductive material which is much greater in amplitude than the test current pulse; thereafter adiabatically reading and comparing the resistance of the stressed isolated conductive material with the test resistance reading to determine a difference value; and determining from the comparison result whether the isolated conductive material has a constriction which is below a threshold cross-sectional size.

14. The method recited in claim 13, wherein the threshold cross-section is no more than 25 percent of the predetermined cross-section.

15. The method recited in claim 13, wherein the stress current pulse amplitude is several times greater than the test current.

16. The method recited in claim 13, wherein the steps of applying a test current pulse, reading the resulting resistance, applying the stress current pulse, reading the resulting resistance, and determining from the comparison whether there is a constriction below a threshold cross-section are applied cyclically a plurality of times and the difference values are averaged to improve difference value resolution.

17. The method recited in claim 16, wherein there are a multiplicity of complete, independent test cycles of applying test and stress current pulses and calculating the resistance difference values conducted per second.

18. The method recited in claim 17, wherein the current pulses range from 10 μsec to 100 μsec in duration.

19. The method recited in claim 18, wherein the current pulses are 10 μsec in duration.

20. The method recited in claim 13, wherein said reading and comparing step is accomplished no more than 10 μsec to 40 μsec after the stress current is applied.

21. The method recited in claim 16, and comprising the further step of applying a multiplicity of circuit stabilizing clock pulses between sequential cycles of measurements, the clock pulses having an amplitude substantially less than the amplitude of the test current pulses.

22. The method recited in claim 13, and comprising the further step of applying a second test current pulse to the isolated conductive material immediately following the stress current application.

23. The method recited in claim 22, wherein the first and second test current pulses range from 10 μsec to 100 μsec in duration and the stress current pulse ranges from 2 μsec to 5 μsec in duration.

24. The method recited in claim 22, wherein the first and second test current pulses are of equal magnitude and the stress current pulse is several times higher in magnitude than the test current pulses.

25. The method recited in claim 1, wherein the stress current amplitude is much greater than the test current amplitude and less than would be required to burn out the constriction in the electrical conductor.

26. The method recited in claim 7, wherein the stress current pulse results in at least a 10° C. increase in temperature of the constriction in the electrical conductor.

27. The method recited in claim 6, wherein at least 40 complete, independent test cycles are accomplished per second.

28. The method recited in claim 17, wherein at least 40 complete, independent test cycles are accomplished per second.

* * * * *